United States Patent
Liu et al.

(10) Patent No.: US 9,373,529 B2
(45) Date of Patent: Jun. 21, 2016

(54) PROCESS TOOL HAVING THIRD HEATING SOURCE AND METHOD OF USING THE SAME

(71) Applicant: TAIWAN SEMICONDUCTOR MANUFACTURING COMPANY, LTD., Hsinchu (TW)

(72) Inventors: Su-Hao Liu, Jhongpu Township (TW); Chien-Hung Lin, Taichung (TW); Ziwei Fang, Hsinchu (TW); Ker-Hsun Liao, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 250 days.

(21) Appl. No.: 14/060,998

(22) Filed: Oct. 23, 2013

(65) Prior Publication Data

US 2015/0108107 A1  Apr. 23, 2015

(51) Int. Cl.
*H01L 21/67* (2006.01)

(52) U.S. Cl.
CPC ...... *H01L 21/67109* (2013.01); *H01L 21/6719* (2013.01); *H01L 21/67115* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 5,763,856 A * | 6/1998 | Ohkase | H05B 3/66 | 118/725 |
| 6,310,328 B1 * | 10/2001 | Gat | H01L 21/67115 | 118/725 |
| 6,610,967 B2 * | 8/2003 | Gat | H01L 21/67115 | 118/724 |
| 6,727,474 B2 * | 4/2004 | Gat | H01L 21/67115 | 118/724 |
| 6,844,528 B2 * | 1/2005 | Ratliff | C23C 16/455 | 118/50.1 |
| 2001/0002668 A1 * | 6/2001 | Gat | H01L 21/67115 | 219/390 |
| 2002/0005400 A1 * | 1/2002 | Gat | H01L 21/67115 | 219/390 |
| 2003/0089698 A1 * | 5/2003 | Ratliff | C23C 16/455 | 219/390 |
| 2010/0200566 A1 * | 8/2010 | Komino | H01L 21/67109 | 219/444.1 |
| 2010/0258049 A1 * | 10/2010 | Ishikawa | C23C 16/34 | 117/98 |
| 2013/0062333 A1 * | 3/2013 | Emami | H01L 21/67109 | 219/438 |
| 2014/0242530 A1 * | 8/2014 | An | H01L 21/67115 | 432/9 |

* cited by examiner

*Primary Examiner* — Joseph M Pelham
(74) *Attorney, Agent, or Firm* — Hauptman Ham, LLP

(57) ABSTRACT

A processing tool includes a chamber configured to receive a wafer, the chamber having a sidewall and a sidewall heating source configured to heat the sidewall of the chamber. The processing tool further includes a first heating source configured to provide energy to an interior of the chamber through a top surface of the chamber and a second heating source configured to provide energy to the interior of the chamber through a bottom surface of the chamber. The sidewall heating source is separate from the first heating source and the second heating source.

20 Claims, 5 Drawing Sheets

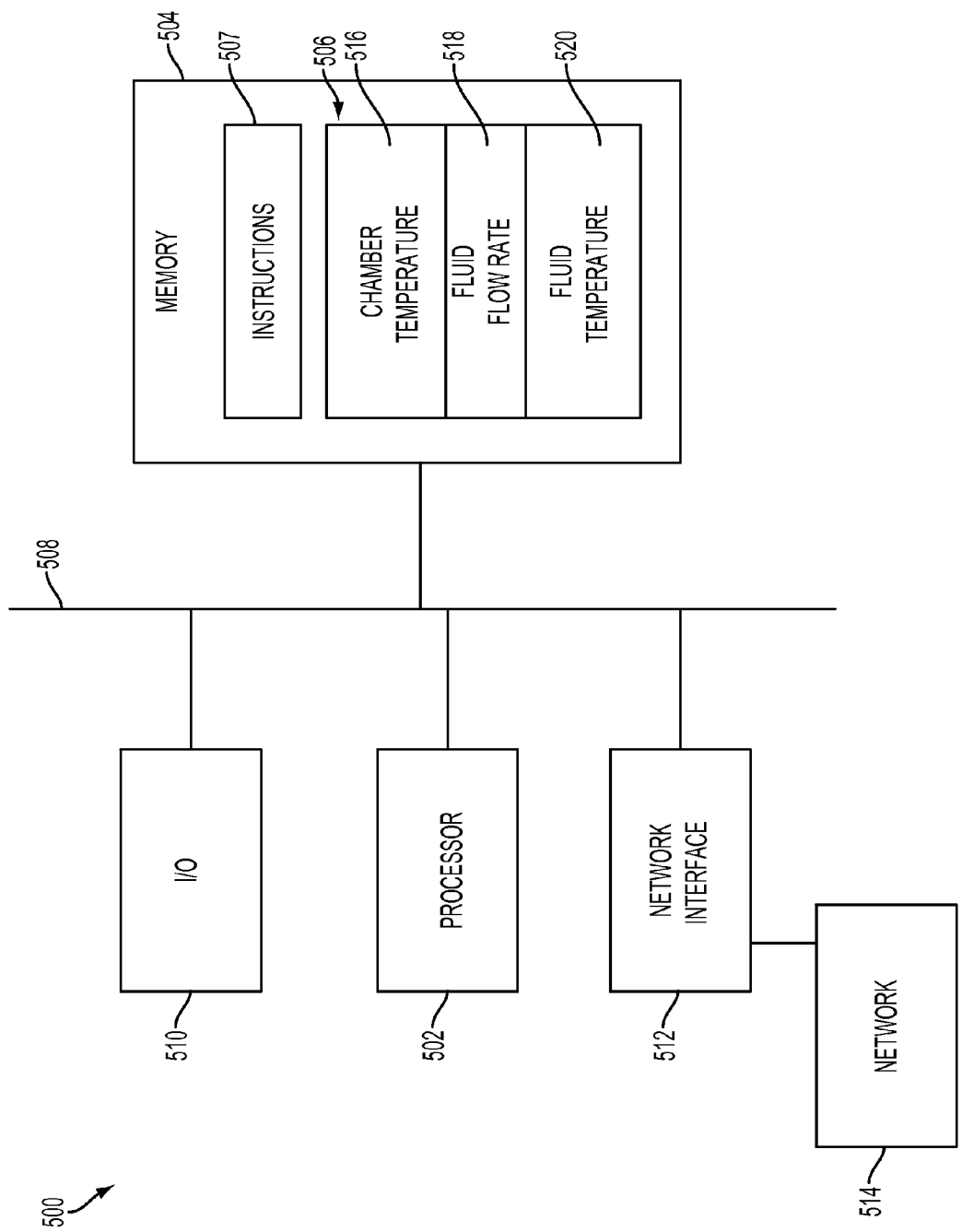

PROCESS TOOL HAVING THIRD HEATING SOURCE AND METHOD OF USING THE SAME

BACKGROUND

Process tools are used in semiconductor manufacturing in various applications, such as annealing, implantation, deposition or other processes. Process tools include a table or mount for supporting a wafer to be processed. The wafer is placed inside the process tool and processed under various temperatures and pressures.

A temperature within the process tool is controlled using heating sources. In some instances, the heating sources are digitally controlled by selectively activating or deactivating the heating source. In some instances, a heating source is located on a wide side of a wafer table. In some instances, a heating source is located both above and below the wafer table. When a processing temperature is above an ambient temperature, an outer surface of the processing tool conducts heat to a surrounding environment by radiation heat transfer.

A pre-heating process for a process tool which includes digitally controlled heating sources heats the process tool by activating one or more of the digitally controlled heating sources.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 5 is a block diagram of a controller for controlling a temperature of a heating source for a processing tool in accordance with one or more embodiments.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
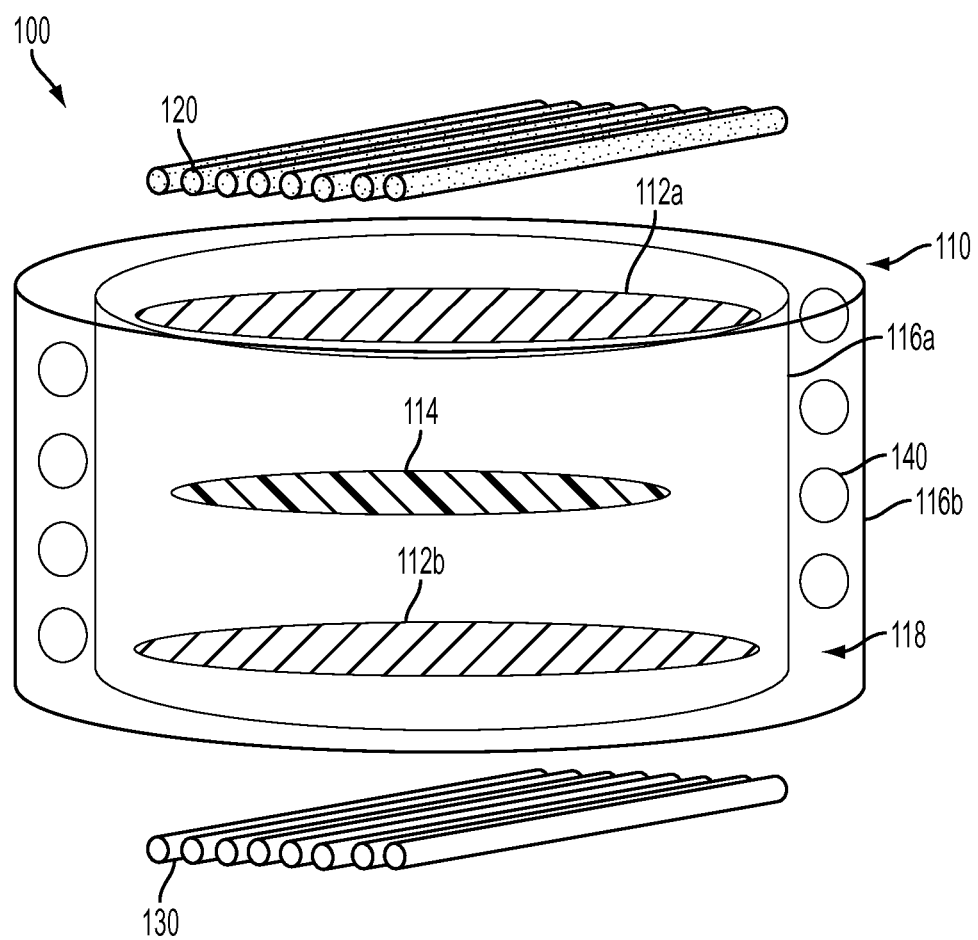
FIG. 1 is a cross sectional view of a processing tool in accordance with one or more embodiments.

FIG. 1 is a cross sectional view of a processing tool 100 in accordance with one or more embodiments. Processing tool 100 includes a chamber 110 configured to house a wafer. Chamber 110 includes a first window 112a on a top surface of the chamber, and a second window 112b on a bottom surface of the chamber. First window 112a and second window 112b are configured to allow light or heat to propagate from an outside of chamber 110 to an inside of the chamber. Chamber 110 further includes a wafer table 114 configured to support the wafer in chamber 110. Chamber 110 has an inner wall 116a surrounding first window 112a, second window 112b, and wafer table 114. An outer wall 116b surrounds inner wall 116a with a space 118 defined between the inner wall and the outer wall. Processing tool 100 further includes a first heating source 120 configured to generate heat. Heat generated by first heating source 120 is configured to pass through first window 112a into chamber 110. A second heating source 130 is also configured to generate heat which propagates into chamber 110 through second window 112b. Processing tool 100 further includes a third heating source 140 disposed in the space between inner wall 116a and outer wall 116b. Third heating source 140 is a coil which surrounds inner wall 116a and is configured to transfer heat into chamber 110 through the inner wall.

Chamber 110 is configured to house the wafer to be processed by processing tool 100. Chamber 110 is capable of withstanding sufficient temperature and pressure to avoid damage during processing of the wafer. In some embodiments, chamber 110 is configured to house more than one wafer at a time. In some embodiments, chamber 110 is configured to house a single wafer. Chamber 110 includes a port (not shown) for loading and unloading wafers into the chamber.

First window 112a is configured to allow light or heat from first heating source 120 to propagate into chamber 110. In some embodiments, first window 112a is configured to allow both light and heat from first heating source 120 to propagate into chamber 110. First window 112a has sufficient strength to withstand an operating pressure of processing tool 100. First window 112a has a glass transition temperature above an operating temperature of processing tool 100. In some embodiments, first window 112a is configured to limit a wavelength of light passing into chamber 110. In some embodiments, first window 112a is configured to pass infrared (IR) radiation into chamber 110. In some embodiments, first window 112a includes quartz, calcium fluoride, or other suitable materials. First window 112a has a circular shape as seen in a top view. In some embodiments, first window 112a is rectangular, oval, or another suitable shape. In some embodiments, a diameter of first window 112a is substantially equal to a diameter of inner wall 116a. In some embodiments, the diameter of first window 112a is less than the diameter of inner wall 116a.

Second window 112b is configured to allow light or heat from second heating source 130 to propagate into chamber 110. In some embodiments, second window 112b is configured to allow both light and heat from second heating source 130 to propagate into chamber 110. Second window 112b has sufficient strength to withstand an operating pressure of processing tool 100. Second window 112b has a glass transition temperature above an operating temperature of processing tool 100. In some embodiments, second window 112b is configured to limit a wavelength of light passing into chamber 110. In some embodiments, second window 112b is configured to pass IR radiation into chamber 110. In some embodiments, second window 112b includes quartz, calcium fluoride, or other suitable materials. In some embodiments, second window 112b is a same material as first window 112a. In some embodiments, second window 112b is a different material from first window 112a. Second window 112b has a circular shape as seen in a top view. In some embodiments, second window 112b is rectangular, oval, or another suitable shape. In some embodiments, second window 112b has a same shape as first window 112a. In some embodiments, second window 112b has a different shape from first window 112a. In some embodiments, a diameter of second window 112b is substantially equal to a diameter of inner wall 116a. In some embodiments, the diameter of second window 112b is less than the diameter of inner wall 116a. In some embodiments, a diameter of second window 112b is a same diameter as first window 112a. In some embodiments, the diameter of second window 112b is different from the diameter of first window 112a.

Wafer table 114 is configured to support the wafer to be processed by processing tool 100. In some embodiments, wafer table 114 is a thermally conductive material. In some embodiments, wafer table 114 is a thermally insulating material. In some embodiments, chamber 110 includes multiple wafer tables 114. In some embodiments, wafer table 114 is centered within chamber 110. In some embodiments, wafer table 114 is off-center within chamber 110.

Inner wall 116a is configured to enclose the wafer to be processed by processing tool 100. Inner wall 116a is a thermally conductive material. In some embodiments, inner wall 116a includes aluminum, steel, or another suitable thermally conductive material. Inner wall 116a has sufficient strength to withstand the operating pressure of processing tool 100. Inner wall 116a has a melting point above the operating temperature of processing tool 100. Inner wall 116a is cylindrical. In some embodiments, inner wall 116a is a quadrilateral prism, conical, or other suitable shape.

Outer wall 116b is configured to enclose inner wall 116a with space 118 therebetween. In some embodiments, outer wall 116b is a thermally conductive material. In some embodiments, outer wall 116b includes aluminum, steel, or another suitable thermally conductive material. In some embodiments, outer wall 116b includes a same material as inner wall 116a. In some embodiments, outer wall 116b includes a different material from inner wall 116a. Outer wall 116b has sufficient strength to withstand the operating pressure of processing tool 100. Outer wall 116b has a melting point above the operating temperature of processing tool 100. Outer wall 116b is cylindrical. In some embodiments, outer wall 116b is a quadrilateral prism, conical, or other suitable shape. In some embodiments, a shape of outer wall 116b is a same shape as inner wall 116a. In some embodiments, a shape of outer wall 116b is a different shape from inner wall 116a.

Space 118 is between inner wall 116a and outer wall 116b. Space 118 includes third heating source 140. In some embodiments, space 118 is a vacuum. In some embodiments, space 118 includes an insulation material. In some embodiments, the insulation material surrounds third heating source 140.

First heating source 120 is configured to generate heat or light which is transferred into chamber 110 through first window 112a. In some embodiments, first heating source 120 is a lamp configured to emit both heat and light. In some embodiments, the lamp is configured to emit a specific wavelength range of light. In some embodiments, first heating source 120 is configured to be digitally controlled.

Second heating source 130 is configured to generate heat or light which is transferred into chamber 110 through second window 112b. In some embodiments, second heat source 130 is a lamp configured to emit both heat and light. In some embodiments, the lamp is configured to emit a specific wavelength range of light. In some embodiments, second heating source 130 is configured to be digitally controlled. In some embodiments, an amount of heat or an intensity of light from second heating source 130 is equal to an amount of heat or an intensity of light form first heating source 120. In some embodiments, the amount of heat or the intensity of light from second heating source 130 is different from the amount of heat or the intensity of light form first heating source 120. In some embodiments, a wavelength range of second heating source 130 is equal to a wavelength range of first heating source 120. In some embodiments, the wavelength range of second heating source 130 is different from the wavelength range of first heating source 120.

Third heating source 140 is configured to transfer heat into chamber 110 through inner wall 116a. Third heating source 140 is a coil disposed in space 118. A separate pump (not shown) is used to move the heating fluid through third heating source 140. In operation, a heating fluid passes through the coil and transfers heat into chamber 110 through radiative heat transfer. In some embodiments where third heating source 140 is in contact with inner wall 116a, the third heating source transfers heat into chamber 110 through conductive heat transfer. In some embodiments, the heating fluid is water, inert gas or other suitable heating fluids. In some embodiments, the inert gas includes, nitrogen, helium, argon, or another suitable inert gas.

In some embodiments, a temperature of the heating fluid is controlled using an external controller to provide analog control for heating provided by third heating source 140. In some embodiments, the controller is configured to control a separate heat exchanger and the separate pump to regulate the temperature of the heating fluid.

In some embodiments, the coil is removed and the heating fluid passes through a cavity defined by space 118. An inlet port is defined in a first portion of outer wall 116b to allow the heating fluid to enter the cavity. An outlet port is defined in a second portion of outer wall 116b to allow the heating fluid to exit the cavity.

In comparison with processing tools which do not include a third heating source, processing tool 100 reduces heat loss through sidewalls, e.g., inner wall 116a, of a chamber, e.g., chamber 110. Reduced heat loss results in a more even temperature distribution across a surface of the wafer being processed. A temperature gradient across a surface of the wafer being processed means that edge portions of the wafer, closer to the sidewalls, experience different processing conditions with respect to a center portion of the wafer.

For example, in an anneal process for diffusing a dopant within a semiconductor device. A temperature at the center portion of the wafer will be higher than a temperature at edge portions of the wafer. The lower temperature at the edge portions results in a lower amount of dopant diffusion. In some instances, the decreased amount of dopant diffusion is sufficient to prevent the semiconductor device from working properly.

In contrast, processing tool 100 includes third heating source 140 which is configured to provide heat to inner wall 116a and reduce the temperature gradient across the wafer being processed. As a result dies formed across the wafer are more uniform, which increases production yield. In addition, by reducing an amount of heat loss through inner wall 116a, an amount of energy consumed by first heating source 120 and second heating source 130 is also reduced which saves energy during production of the semiconductor device.

Third heating source 140 also allows processing tool 100 to be pre-heated using an analog controlled heating source. In arrangements which do not include third heating source 140, digitally controlled lamps would be activated in order to preheat chamber 110. A pre-heating temperature of chamber 110 is not able to be precisely controlled using only digitally controlled lamps because the lamps are either ON or OFF. In contrast, third heating source 140 provides more precise control of the pre-heating temperature by regulating the temperature of the heating fluid. As a result, chamber 110 is able to be pre-heated with less power consumption and with more precise control through the inclusion of third heating source 140.

Figure 2:
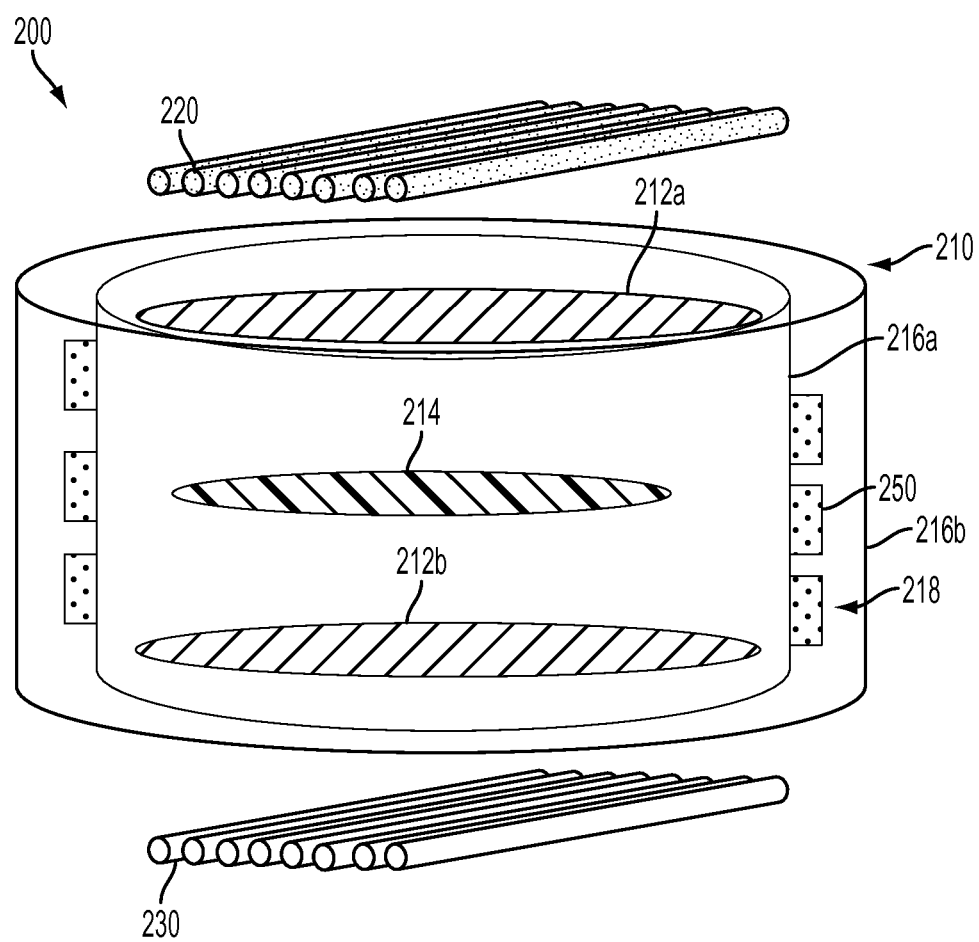
FIG. 2 is a cross sectional view of a processing tool in accordance with one or more embodiments.

FIG. 2 is a cross sectional view of a processing tool 200 in accordance with one or more embodiments. Processing tool 200 is similar to processing tool 100 (FIG. 1). Similar elements have a same reference number increased by 100. In comparison with processing tool 100, processing tool 200 includes third heating source 250 in place of third heating source 140.

Third heating source 250 is a controllable electrical resistance heater. In some embodiments, an amount of heat generated using third heating source 250 is controllable by an external controller. In some embodiments, the amount of heat generated is controlled by regulating a current through third heating source 250. In operation, third heating source 250 transfers heat into chamber 210 through inner wall 216a by conductive heat transfer.

By regulating the current through third heating source 250, the third heat source in processing tool 200 also provides analog control of a temperature applied to inner wall 216a, similar to processing tool 100. Third heating source 250 is also capable of pre-heating chamber 210.

Figure 3:
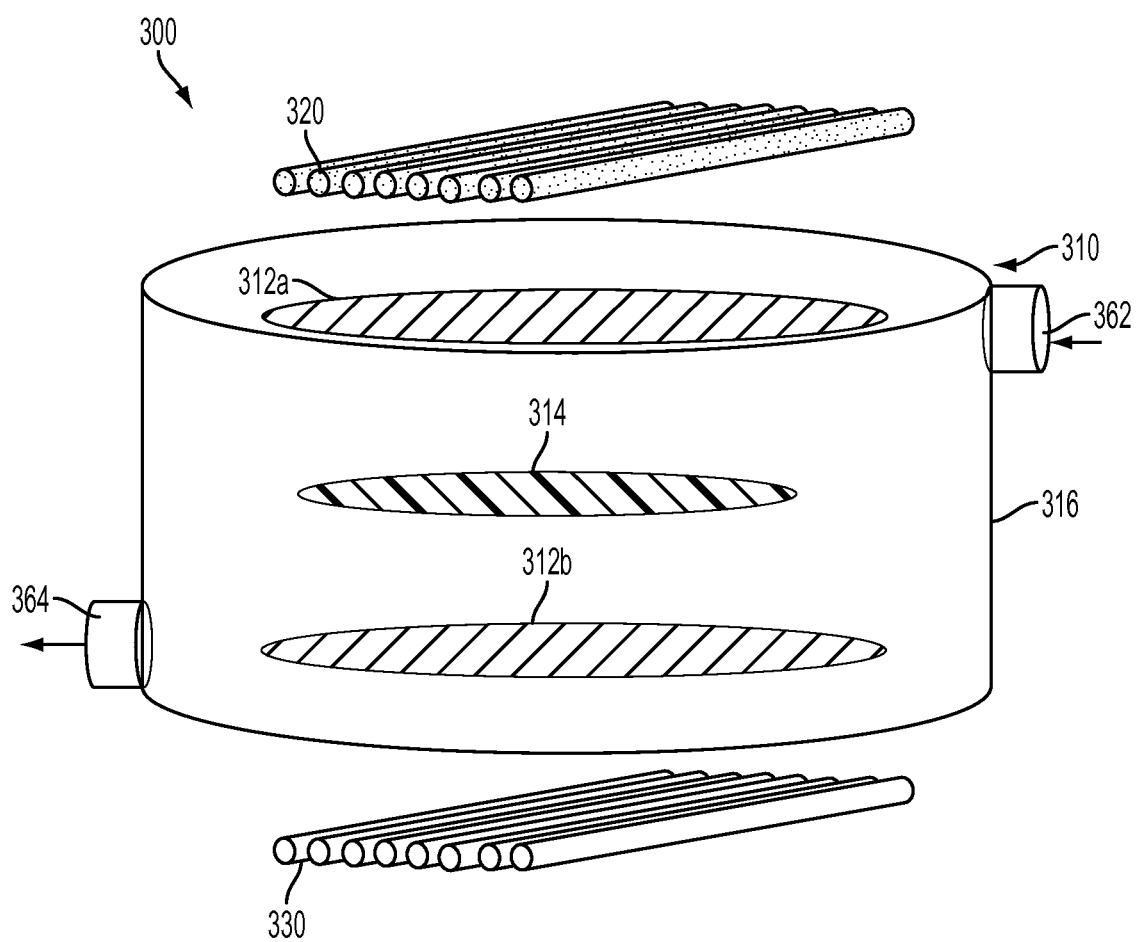
FIG. 3 is a cross sectional view of a processing tool in accordance with one or more embodiments.

FIG. 3 is a cross sectional view of a processing tool 300 in accordance with one or more embodiments. Processing tool 300 is similar to processing tool 100 (FIG. 1). Similar elements have a same reference number increased by 200. In comparison with processing tool 100, processing tool 300 introduces a heating fluid directly into chamber 310. Processing tool 300 includes an inlet port 362 and an outlet port 364 to allow the heating fluid to flow through chamber 310. Inlet port 362 is near an upper surface of chamber 310 near first window 312a and outlet port 364 is near a bottom surface of chamber 310 near second window 312b. In some embodiments, inlet port 362 or outlet port 364 is located in a different location on chamber 310.

The heating fluid for processing tool 300 is selected to avoid reacting with the wafer to be processed. In some embodiments, the heating fluid is selected to avoid being ionized by first heating source 320 or second heating source 330 while passing through chamber 310. In some embodiments, a flow rate of the heating fluid is regulated to prevent movement of the wafer to be processed. In some embodiments, a density of the heating fluid is selected to avoid floating the wafer to be processed.

A temperature in chamber 310 is controllable in a similar manner to that described with respect to processing tool 100 (FIG. 1). By controlling the temperature and the flow rate of the heating fluid, the temperature in chamber 310 is adjusted to reduce heat transfer through wall 316 and to pre-heat the chamber.

Figure 4:
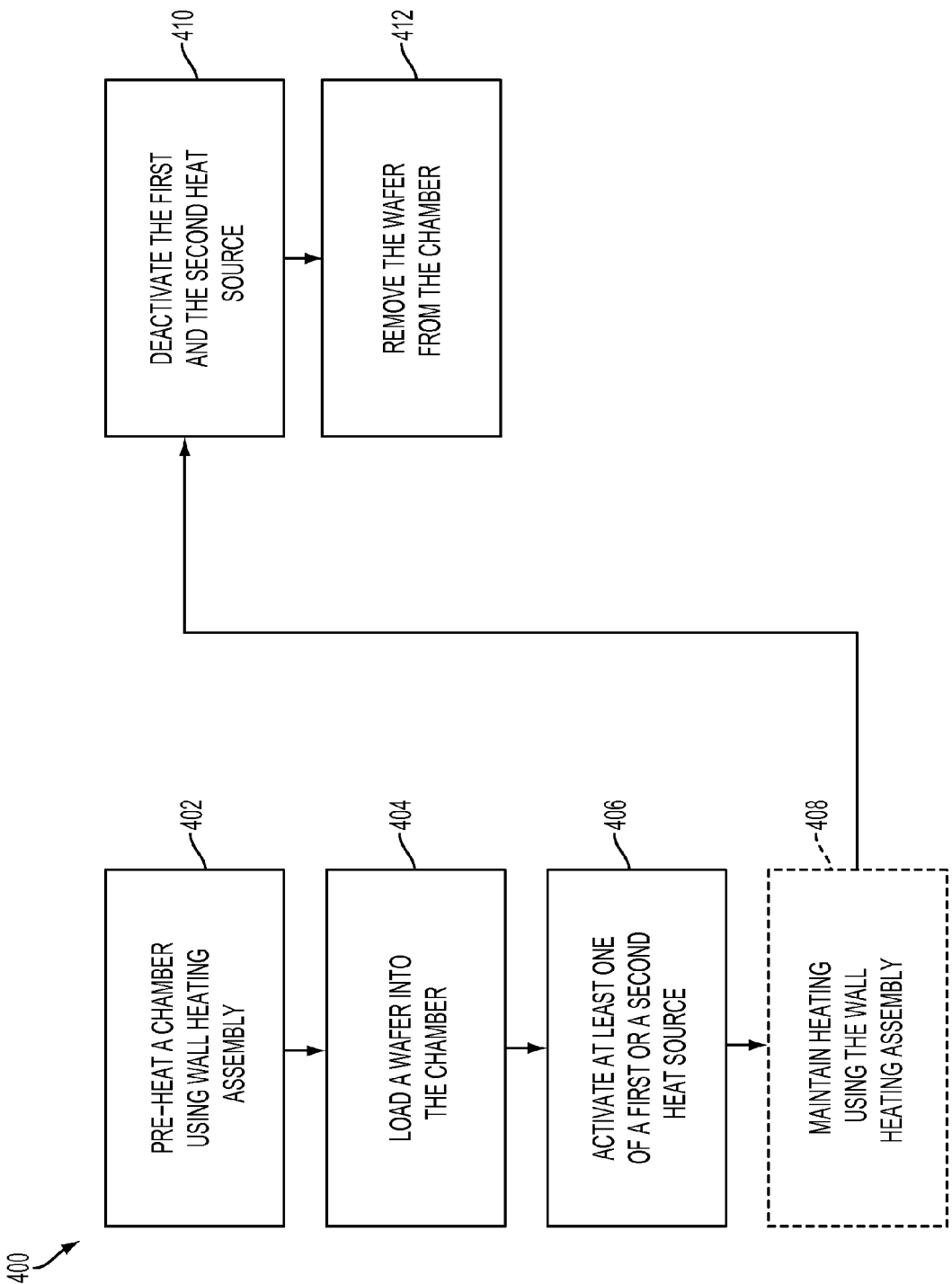
FIG. 4 is a flow chart of a method of operating a processing tool in accordance with one or more embodiments.

FIG. 4 is a flow chart of a method 400 of operating a processing tool in accordance with one or more embodiments. Method 400 begins with operation 402 in which a chamber is pre-heated using a wall heating assembly. The wall heating assembly provides heat energy into the chamber by heating sidewalls of the chamber. In some embodiments, the wall heating assembly is third heating source 140 (FIG. 1), third heating source 250 (FIG. 2), or another suitable heating source on an exterior of the sidewall. In some embodiments, the wall heating assembly includes passing a heating fluid along an interior side of the sidewall, as in processing tool 300 (FIG. 3).

A temperature of the chamber during the pre-heating is controlled by a controller separate from the processing tool. In some embodiments, the controller controls the temperature of the chamber by controlling a fluid temperature and a fluid flow rate of a heating fluid. In some embodiments, the controller controls the temperature of the chamber by controlling a current supplied to an electric resistive heater. Controlling the temperature of the chamber using the controller allows precise regulation of the chamber temperature without activating a heating source used for processing wafers. Controlling the chamber temperature in this manner increases a longevity of the heating sources used for processing wafers and reduces energy consumed during semiconductor device production.

Method 400 continues with operation 404 in which a wafer is loaded into the chamber. The wafer is loaded into the chamber through a port in the chamber. In some embodiments, the wafer is loaded into the chamber using a robotic device. In some embodiment, the wafer is manually loaded into the chamber. In some embodiments, more than one wafer is loaded into the chamber at a time. In some embodiments, the wafer is loaded into the chamber from a front opening universal pod (FOUP).

In operation 406, at least one of a first heating source or a second heating source is activated. In some embodiments, the first heating source provides light or heat energy from a top of the chamber, e.g., first heating source 120 (FIG. 1) through first window 112a. In some embodiments, the second heating source provides light or heat energy from a bottom of the chamber, e.g., second heating source 130 through second window 112b. In some embodiments, both the first heating source and the second heating source are activated to be ON at a same time.

Activating the first heating source or the second heating source heats the wafer loaded the chamber in operation 404. In some embodiments, the heat generated by the first heating source or the second heating source is sufficient to anneal the wafer. In some embodiments, the heater generated by the first heating source or the second heating source is sufficient to activate dopants implanted in the wafer.

In optional operation 408, heating using the wall heating assembly is continued during activation of at least one of the first heating source or the second heating source. Heat generated by the first heating source and the second heating source enters into the chamber and is conducted through sidewalls of the chamber by radiative heat transfer. In instances, where a duration of activation of at least one of the first heating source or the second heating source is sufficiently short and the pre-heat temperature using the wall heating assembly is sufficiently high, operation 408 is omitted. Operation 408 is omitted because the amount of heat transferred through the sidewall of the chamber is low enough to avoid a significant temperature gradient across the surface of the wafer. In some instances, the heat transferred would be low because a temperature difference between the sidewall and the chamber interior is reduced by the pre-heating in operation 402. As a result, a driving mechanism for heat transfer from the chamber interior to the sidewall is reduced producing a smaller temperature gradient in comparison with sidewalls having an ambient temperature.

In some embodiments, where the duration of activation is long or the pre-heat temperature is low, the wall heating assembly continues operation during at least a portion of the duration of activation for at least one of the first heating source or the second heating source. In some embodiments, the wall heating assembly continues operation during an entirety of the duration of activation for at least one of the first heating source or the second heating source.

In some embodiments, continued heating using the wall heating assembly is controlled using a controller. In some embodiments, the controller monitors a temperature of the interior of the chamber, a temperature of the heating fluid or a flow rate of the heating fluid. The controller is able to determine whether heat loss through the sidewall exceeds a threshold value. If the threshold value is exceeded, the controller controls the wall heating assembly to continue heating, in some embodiments. If the threshold value is not exceeded, the controller turns OFF the wall heating assembly, in some embodiments.

Method 400 continues with operation 410, in which the first heating source and the second heating source are deactivated. In some embodiments, the wall heating assembly continues operation following deactivation of the first heating source and the second heating source.

In operation 412, the wafer is removed from the chamber. The wafer is removed from the chamber through the port in the chamber. In some embodiments, the wafer is removed from the chamber using a robotic device. In some embodiment, the wafer is manually removed from the chamber. In some embodiments, more than one wafer is removed from the chamber at a time. In some embodiments, the wafer is removed from the chamber and loaded into a FOUP.

FIG. 5 is a block diagram of a controller 500 for controlling a temperature of a heating source for a processing tool in accordance with one or more embodiments. Controller 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for controlling a sidewall temperature of a processing tool. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 400 (FIG. 4) or in association with processing tool 100 (FIG. 1), processing tool 200 (FIG. 2), or processing tool 300 (FIG. 3).

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause controller 500 to perform method 400. In some embodiments, the storage medium 504 also stores information needed for performing a method 400 as well as information generated during performing the method 400, such as a chamber temperature parameter 516, a material flow rate parameter 518, a fluid temperature parameter 520, and/or a set of executable instructions to perform the operation of method 400.

In some embodiments, the storage medium 504 stores instructions 507 for interfacing with manufacturing machines, such as heat exchangers, pumps or fluid supplies. The instructions 507 enable processor 502 to generate manufacturing instructions readable by the manufacturing machines to effectively implement method 400 during a manufacturing process.

Controller 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

Controller 500 also includes network interface 512 coupled to the processor 502. Network interface 512 allows controller 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more controllers 500, and information such as chamber temperature, fluid flow rate and fluid temperature are exchanged between different controllers 500 via network 514.

Controller 500 is configured to receive information related to a chamber temperature through a temperature sensing element. In some embodiments, the temperature sensing element includes a thermometer, a thermocouple, or another suitable temperature sensing device. The information is transferred to processor 502 via bus 508 to determine the temperature of the chamber, e.g., chamber 110 (FIG. 1), chamber 210 (FIG. 2), or chamber 310 (FIG. 3). The chamber temperature is then stored in computer readable medium 504 as chamber temperature parameter 516. Controller 500 is configured to receive information related to fluid flow rate through a sensor. In some embodiments, the sensor is a pressure sensor, a flow sensor or another type of sensing element. The information is transferred to processor 502 via bus 508 to determine the fluid flow rate. The information is stored in computer readable medium 504 as fluid flow rate parameter 518. Controller 500 is configured to receive information related to a fluid temperature through a temperature sensing element. In some embodiments, the temperature sensing element includes a thermometer, a thermocouple, or another suitable temperature sensing device. The information is transferred to processor 502 via bus 508 to determine the temperature of the fluid. The fluid temperature is then stored in computer readable medium 504 as fluid temperature parameter 520.

During operation, processor 502 executes a set of instructions to determine whether an amount of heat transfer through the sidewall of a processing tool exceeds a threshold value. Processor 502 then generates a signal for transmission to manufacturing machines based on the determined amount of heat transfer to regulate a fluid flow rate and fluid temperature of a heating fluid supplied to the processing tool.

One aspect of this description relates to a processing tool. The processing tool includes a chamber configured to receive a wafer, the chamber having a sidewall and a sidewall heating source configured to heat the sidewall of the chamber. The processing tool further includes a first heating source configured to provide energy to an interior of the chamber through a top surface of the chamber and a second heating source configured to provide energy to the interior of the chamber through a bottom surface of the chamber. The sidewall heating source is separate from the first heating source and the second heating source.

Another aspect of this description relates to a processing tool. The processing tool includes a chamber configured to receive a wafer. The chamber includes an inner sidewall defining an interior of the chamber, an outer sidewall surrounding the inner sidewall, and a space between the inner sidewall and the outer sidewall. The processing tool further includes a sidewall heating source configured to heat the inner sidewall. The processing tool further includes a first heating source configured to provide energy to the interior of the chamber and a second heating source configured to provide energy to the interior of the chamber. The sidewall heating source is separate from the first heating source and the second heating source.

Still another aspect of this description relates to a method of using a processing tool having a chamber comprising a sidewall. The method includes pre-heating the sidewall of the chamber using a sidewall heating source and loading a wafer into the chamber. The method further includes activating at least one of a first heating source or a second heating source, the at least one first heating source or second heating source being separate from the sidewall heating source. The method further includes controlling the sidewall heating source to regulate a temperature of the sidewall of the chamber.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A processing tool comprising:
   a chamber configured to receive a wafer, the chamber having a sidewall;
   a sidewall heating source configured to heat the sidewall of the chamber, wherein the sidewall heating source is configured to receive a heating fluid;
   a first heating source configured to provide energy to an interior of the chamber through a top surface of the chamber; and
   a second heating source configured to provide energy to the interior of the chamber through a bottom surface of the chamber,
   wherein the sidewall heating source is separate from the first heating source and the second heating source.

2. The processing tool of claim 1, wherein the sidewall heating source comprises:
   an inlet port for permitting the heating fluid to pass into the interior of the chamber; and
   an outlet port for permitting the heating fluid to exit the interior of the chamber.

3. The processing tool of claim 1, wherein the chamber further comprises an outer sidewall configured to surround the sidewall to form a space therebetween.

4. The processing tool of claim 3, wherein the sidewall heating source comprises a coil configured to receive the heating fluid, and the coil is disposed in the space.

5. The processing tool of claim 3, wherein the heating fluid comprises a gas.

6. The processing tool of claim 3, further comprising an insulating material disposed in the space.

7. The processing tool of claim 1, further comprising:
   a first window configured to allow energy from the first heating source to enter the interior of the chamber; and
   a second window configured to allow energy from the second heating source to enter the interior of the chamber.

8. The processing tool of claim 1, further comprising at least one wafer mount disposed in the chamber, each wafer mount of the at least one wafer mount is configured to support the wafer.

9. The processing tool of claim 1, further comprising a controller configured to regulate the sidewall heating source.

10. The processing tool of claim 9, wherein the controller is configured to provide analog control of the sidewall heating source.

11. A processing tool comprising:
    a chamber configured to receive a wafer, the chamber comprising:
      an inner sidewall defining an interior of the chamber,
      an outer sidewall surrounding the inner sidewall, and
      a space between the inner sidewall and the outer sidewall;
    a sidewall heating source configured to heat the inner sidewall, wherein the sidewall heating source is configured to receive a heating fluid;
    a first heating source configured to provide energy to the interior of the chamber; and
    a second heating source configured to provide energy to the interior of the chamber,
    wherein the sidewall heating source is separate from the first heating source and the second heating source.

12. The processing tool of claim 11, further comprising a coil in the space, wherein the coil is configured to receive the heating fluid.

13. The processing tool of claim 11, wherein the heating fluid is a gas.

14. The processing tool of claim 11, further comprising an insulating material disposed in the space.

15. The processing tool of claim 11, wherein the space is configured to allow the heating fluid to flow between the inner sidewall and the outer sidewall.

16. The processing tool of claim 11, further comprising a controller configured to regulate the sidewall heating source.

17. A method of using a processing tool having a chamber comprising a sidewall, the method comprising:
    pre-heating the sidewall of the chamber using a sidewall heating source;
    loading a wafer into the chamber;
    activating at least one of a first heating source or a second heating source, the at least one first heating source or second heating source being separate from the sidewall heating source; and
    controlling the sidewall heating source to regulate a temperature of the sidewall of the chamber.

18. The method of claim 17, wherein pre-heating the sidewall of the chamber comprises supplying heat to the sidewall of the chamber using an electrical resistive heater.

19. The method of claim 17, wherein pre-heating the sidewall of the chamber comprises supplying a heating fluid to a coil in thermal contact with the sidewall.

20. The method of claim 17, wherein the chamber comprises an outer sidewall surrounding the sidewall to define a space therebetween, and pre-heating the sidewall of the chamber comprises supplying a heating fluid to the space.

* * * * *